United States Patent
Gibet et al.

(10) Patent No.: US 7,598,819 B2
(45) Date of Patent: Oct. 6, 2009

(54) ELECTRONIC CIRCUIT WITH TRANSISTORS SHARING ONE AND THE SAME WELL

(75) Inventors: Stanislas Gibet, Carquefou (FR); Abdellatif Bendraoui, Saint-Julien de Concelles (FR); Gilles Mercier, Carquefou (FR)

(73) Assignee: Atmel Switzerland SARL (CH)

( * ) Notice: Subject to any disclaimer, the term of this patent is extended or adjusted under 35 U.S.C. 154(b) by 231 days.

(21) Appl. No.: 11/311,931

(22) Filed: Dec. 19, 2005

(65) Prior Publication Data

US 2006/0158270 A1    Jul. 20, 2006

(30) Foreign Application Priority Data

Dec. 20, 2004   (FR)   ..................... 04 13603

(51) Int. Cl.
*H03B 5/12*   (2006.01)
(52) U.S. Cl. ............... 331/108 C; 331/167; 331/117 R; 331/117 FE; 331/57; 257/512
(58) Field of Classification Search ........... 331/117 FE, 331/117 R, 167, 57, 108 C; 257/512
See application file for complete search history.

(56) References Cited

U.S. PATENT DOCUMENTS

| | | | |
|---|---|---|---|
| 5,811,341 A | 9/1998 | Davies et al. | 438/279 |
| 5,977,818 A | 11/1999 | Czarnul et al. | 327/543 |
| 6,218,892 B1 | 4/2001 | Soumyanath et al. | 327/537 |
| 6,396,359 B1 * | 5/2002 | Hajimiri et al. | 331/96 |
| 6,545,538 B1 | 4/2003 | Ivanov et al. | 330/255 |
| 6,900,703 B2 * | 5/2005 | Garvin | 331/183 |
| 2003/0031071 A1 | 2/2003 | Kato | 365/207 |

\* cited by examiner

*Primary Examiner*—Arnold Kinkead
(74) *Attorney, Agent, or Firm*—Westman Champlin & Kelly, P.A.; David D. Brush

(57) ABSTRACT

The disclosure relates to an electronic circuit including at least one first and one second differential pair each including a plurality of transistors. All the transistors of said first and second differential pair are included in a single well.

7 Claims, 6 Drawing Sheets

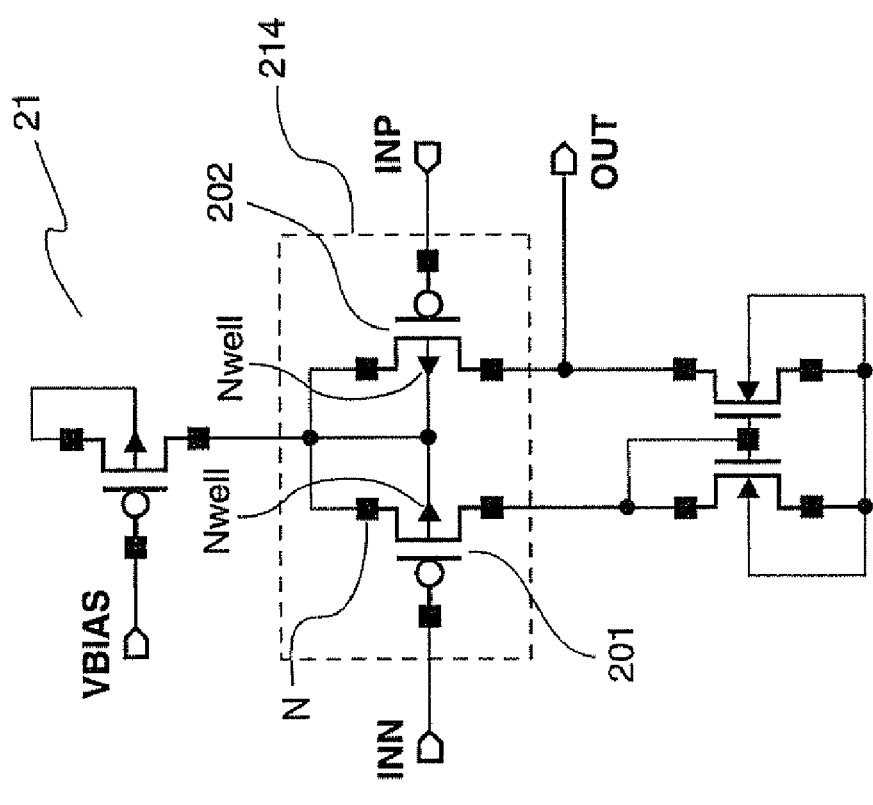
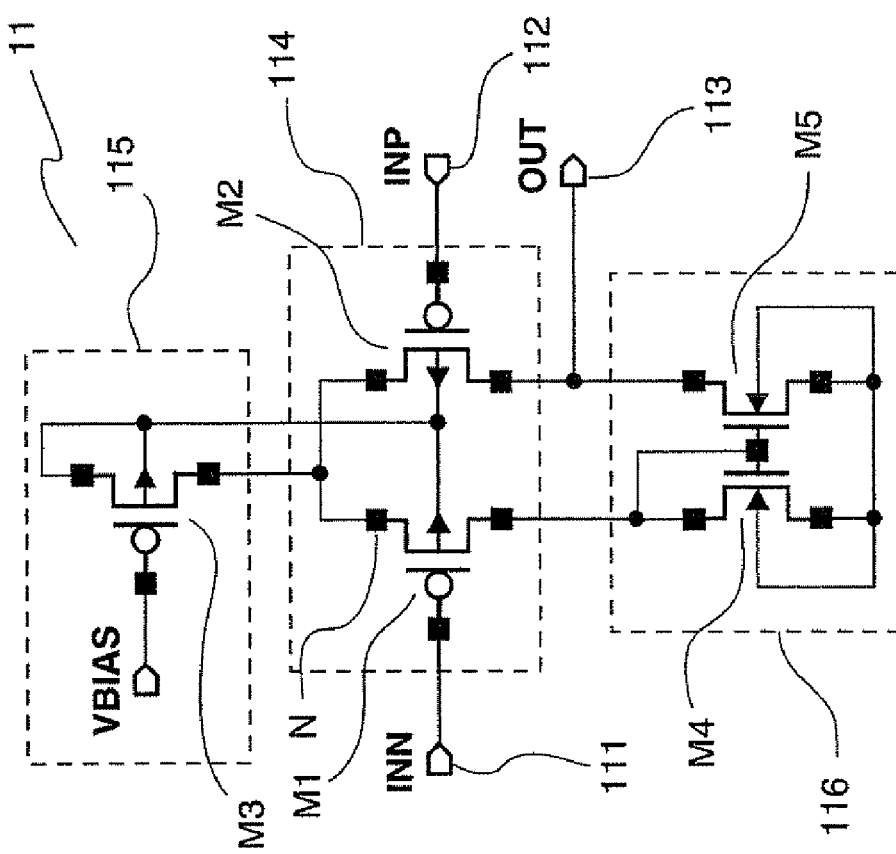
Fig. 2B
(Prior Art)
Fig. 2A
(Prior Art)

US 7,598,819 B2

ELECTRONIC CIRCUIT WITH TRANSISTORS SHARING ONE AND THE SAME WELL

FIELD OF THE DISCLOSURE

The field of the disclosure is that of electronic integrated circuits and more particularly that of integrated circuit design.

To be more precise, the disclosure relates to the optimisation of the topology of integrated circuits, and particularly the optimisation of the topology of voltage-controlled oscillators (VCO).

BACKGROUND OF THE DISCLOSURE

The function of a voltage-controlled oscillator is to generate a periodic output signal, the frequency of which is a function of a continuous voltage applied to an input. It thus allows periodic signals to be generated, the frequency of which is open to selection.

There are several types of voltage-controlled oscillator. A first example of a VCO is the VCO of the RC type, which is based on loading and unloading a capacitance through a capacitor.

A second example of a VCO is the voltage-controlled differential oscillator, designated hereinafter as a differential VCO. The differential VCO conventionally includes four transistor based differential pairs.

FIG. 1 shows a simplified diagram of a conventional differential VCO 10. The differential VCO includes first 11, second 12, third 13 and fourth 14 amplifying stages. Amplifying stages 11 to 14 are polarised by means of a bias voltage VBIAS applied to an input 15 of the differential VCO 10. Each stage includes two inputs, 111 and 112, 121 and 122, 131 and 132, 141 and 142 respectively, and an output 133, 123, 133 and 143 respectively.

The output 133 of the third stage supplies the periodic output voltage of the differential VCO 10 the frequency of which depends on the bias voltage VBIAS.

FIG. 2A shows the diagram of a conventional amplifying stage of the differential VCO 10, for example the first stage 11. For example, all the stages 11 to 14 of the differential VCO 10 are identical.

This first stage 11 conventionally includes:
- a conventional differential pair 114 based on two P-type MOS transistors M1, M2;
- a current source 115 including one P-type MOS transistor M3; and
- an active load 116 based on two N-type MOS transistors M4, M5.

The inputs 111, 112 of the first stage 11 are connected to the gates of the transistors M1, M2 of the differential pair 114. The output 113 of the first stage 11 is connected to the drain of the transistor M2 of the differential pair 114.

The sources of the transistors M1, M2 of the differential pair 114 are connected to one and the same common node N.

A known technique (shown in FIG. 2B) for increasing the power supply rejection of an amplifying stage 21 is to connect the NWELL wells of the transistors 201, 202 of the differential pair 214 to a common node N.

When designing a differential pair that includes two transistors M1 and M2, each of the transistors of the pair, for example the transistor M1, can conventionally be replaced by two transistors M11, M12 each having a gate width two times smaller and a gate length identical to that of the transistor M1. FIG. 3 shows the diagram of a differential pair 314 in which each of the transistors has been split so as to form two pairs of transistors M11 and M12, M22 and M21 respectively. FIG. 4 is a diagram of the topology of the transistors M11, M12, M22 and M21 of the differential pair 314 in FIG. 3 in the case of a "crossed pair" arrangement. A number of metal strips (not shown in FIG. 4) allow the electrical connections in FIG. 3 to be made between the different contacts of the transistors.

It may be noted that in this FIG. 4 but also in those that follow, the areas marked by black dots are doped zones in which the transistors are made.

The 4 transistors of the differential pair 314 are equivalent to two transistors forming the pair 314. The "crossed pair" arrangement makes it possible to ensure a good uniformity of dimensions of these two equivalent transistors when the pair is manufactured.

Indeed, any variation in dimension due to the manufacturing process, and any interference that causes parasitic effects in the transistors (noise, temperature variation, etc) is transmitted in the same way to each of these two equivalent transistors.

In fact, a lack of uniformity in respect of the dimensions of the transistors of a differential pair (for example the pair 314 in FIG. 3) generates an offset voltage between the two inputs of the pair (311 and 312) that may well interfere with the operation of an amplifying stage that includes the pair.

Specialists in the manufacture of transistors therefore consider that it is necessary to employ the "crossed pairs" arrangement when manufacturing a differential pair.

Conventionally, in a differential pair arranged as a "crossed pair", the man skilled in the art combines the four transistors in one and the same well 41 (in FIG. 4). In this way, when a VCO is made based on conventional differential pairs of this kind, each of the pairs is included in a different well.

Unfortunately, a first drawback of this conventional arrangement is that it generates parasitic capacitances (capacitances due to the metal strips connecting the transistors, diffusion capacitance of the transistors, bottom or sidewall capacitance between the wells of the transistors and the substrate, etc) that restrict the performance of the differential VCO, in particular by reducing its oscillation frequency.

VCOs are able to operate in different frequency ranges and to be made according to different technologies, each associated with a pitch that is generally indicated in microns.

The growing need to reduce power consumption and the dimensions of electronic systems based on integrated circuits has led designers of VCOs of this kind to use manufacturing technologies that have an increasingly small pitch.

In this way, for example in order to make a phase locked loop (or PLL) for a USB port according to the USB 2.0 standard, it may be necessary to make VCOs by means of technologies that have a pitch below 0.5 µm and which operate at a frequency of about 480 MHz (for an internal clock of 12 MHz).

One drawback of differential VCOs is, according to the man skilled in the art, that they are unable to operate at significant frequencies (above 300 MHz, in very small-scale technologies, in other words below 0.5 µm).

Indeed, the person skilled in the art considers that, should it be required to make a differential VCO operating at these frequencies from a technology below 0.5 µm, the transistors of the differential pairs of this differential VCO would be too small to ensure good uniformity in the dimensions of the transistors of the VCO despite the use of the "crossed pairs" arrangement.

It is for this reason, generally speaking, that VCOs operating at high frequencies (above 300 MHz) and made from very small-scale technologies (below 0.5 µm) are VCOs of the RC type.

SUMMARY

An embodiment of the present invention is directed to an electronic circuit that includes at least one first and one second differential pair, each including a plurality of transistors. All the transistors of said first and second differential pairs are included in a single well.

A general principle of an embodiment of the invention is based on the implementation of a plurality of differential pairs brought close together so that their transistors share one and the same well.

An embodiment of the invention is equally applicable to circuits based on differential pairs arranged as "crossed pairs" as it is to circuits based on differential pairs that are not arranged as crossed pairs.

In this way, combining the transistors of the differential pairs in a single well makes it possible to obtain circuits based on differential pairs that have parasitic capacitances, particularly bottom and sidewall capacitances, and an occupied semiconductor surface that are clearly smaller compared with conventional circuits.

In one or more embodiments of the invention, the electronic circuit includes four amplifying stages each including a differential pair, all the transistors of said differential pairs being included in a single well.

At least one of said differential pairs may include first and second transistors, which are P-type MOS transistors, and said first and second transistors may share one and the same single drain.

At least one of said differential pairs may include third and fourth transistors, which are N-type MOS transistors, and said first and second transistors may share one and the same single source.

In this way, an embodiment of the invention counters the prejudices of the person skilled in the art by proposing an electronic circuit based on differential pairs with the transistors of the differential pairs not being arranged as a "crossed pair" and therefore able not to be of uniform dimensions.

For at least one differential pair, for example, a double transistor is implemented, being obtained by means of two transistors that share one and the same drain or one and the same source.

Implementing a double transistor of this kind can make it possible to further reduce the parasitic capacitances and the occupied semiconductor surface in the circuit.

According to an embodiment of the invention, the electronic circuit is manufactured by means of a technology with a pitch below 0.5 µm.

According to an embodiment of the invention, the electronic circuit is a voltage-controlled differential oscillator.

For example, the electronic circuit is designed to operate at a frequency above 300 MHz.

In this way, one or more embodiments of the invention propose a differential VCO operating at frequencies above 300 MHz and made by means of a technology below 0.5 µm.

Other characteristics of one or more embodiments of the invention will emerge more clearly from reading the following description of two embodiments, given by way of simple illustrative and non-restrictive examples and of the appended drawings.

BRIEF DESCRIPTION OF THE DRAWINGS

FIGS. 2A and 2B show two diagrams of a conventional amplifying stage based on a differential pair of the differential VCO in FIG. 1;

DETAILED DESCRIPTION OF THE ILLUSTRATIVE EMBODIMENTS

Figure 5:
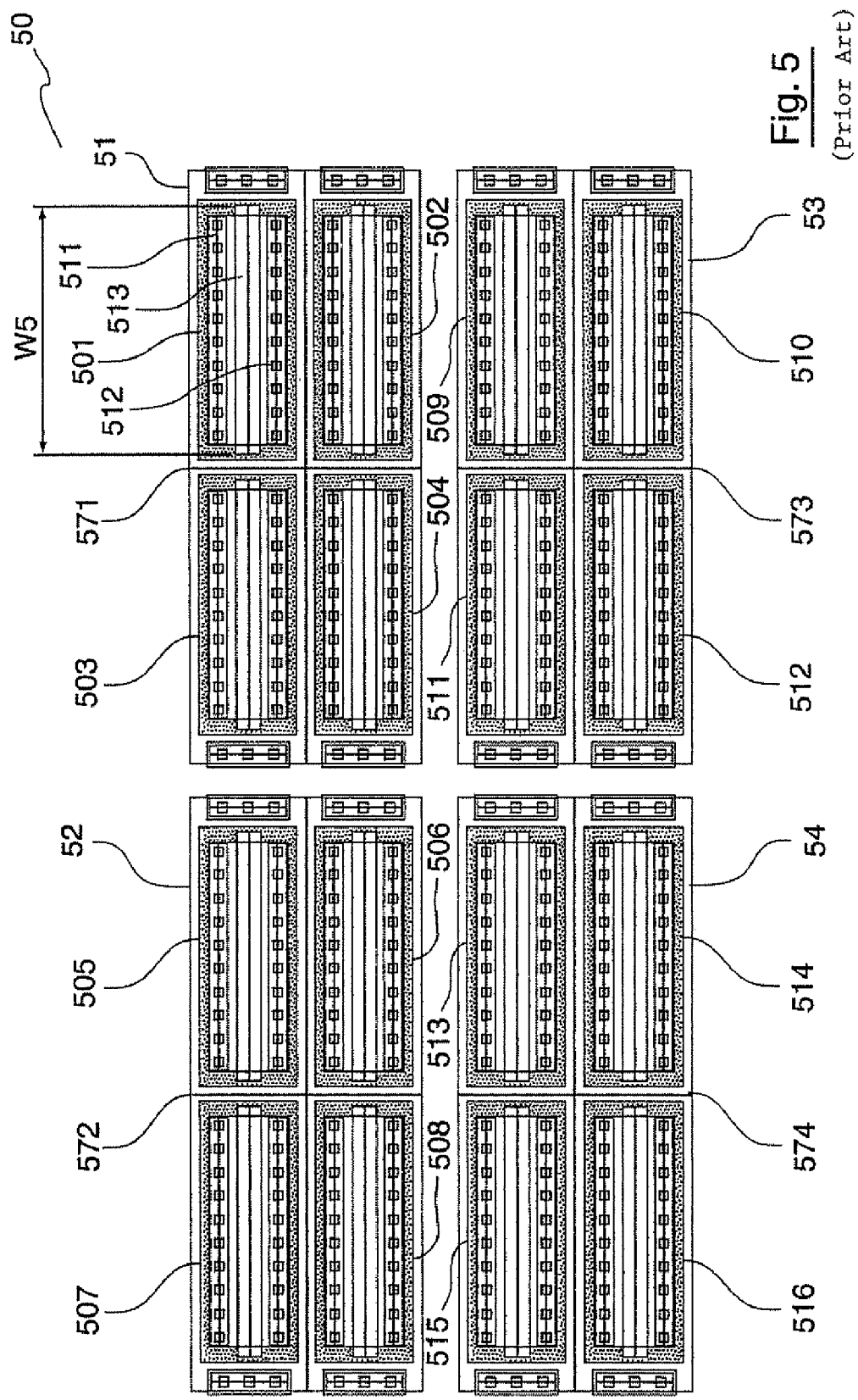
FIG. 5 is a diagram of the topology of the transistors of a conventional differential VCO including four differential pairs arranged as "crossed pairs"

The topology of a conventional differential VCO 50 is shown, in relation to FIG. 5, with the transistors arranged as "crossed pairs".

This VCO 50 includes sixteen P-type MOS transistors 501 to 516, forming first 501, 505, 509, 513, second 502, 506, 510, 514, third 503, 507, 511, 515 and fourth 504, 508, 512, 516 transistors of four differential pairs 51 to 54 (the other components of the VCO 50 are not shown in this FIG. 5).

The four transistors of each of the differential pairs 51 to 54 are manufactured in one and the same well, 571, 572, 573, 574 respectively.

For example, the first transistor 501 of the differential pair 51 of the VCO 50 has a source 5011, a drain 5012 and a gate 5013.

The four differential pairs 51 to 54 occupy a significant semiconductor surface. For example, for transistors 501 to 516 that have a gate width (denoted w5) substantially equal to 4 µm, a total surface occupied by the four differential pairs is obtained that is substantially equal to 280 µm.

A conventional transistor arrangement of this kind for implementing a differential VCO requires the employment of a high number of metal strips in order to establish the electrical connections of the contacts of the transistors needed for the VCO to operate.

In this way, a topology of this kind generates, through the high number of metal strips required, significant parasitic capacitances.

We will consider hereinafter the implementation of differential VCOs through the use of technologies with a pitch below 0.5 µm, and which operate at frequencies above 300 MHz.

Figure 6:
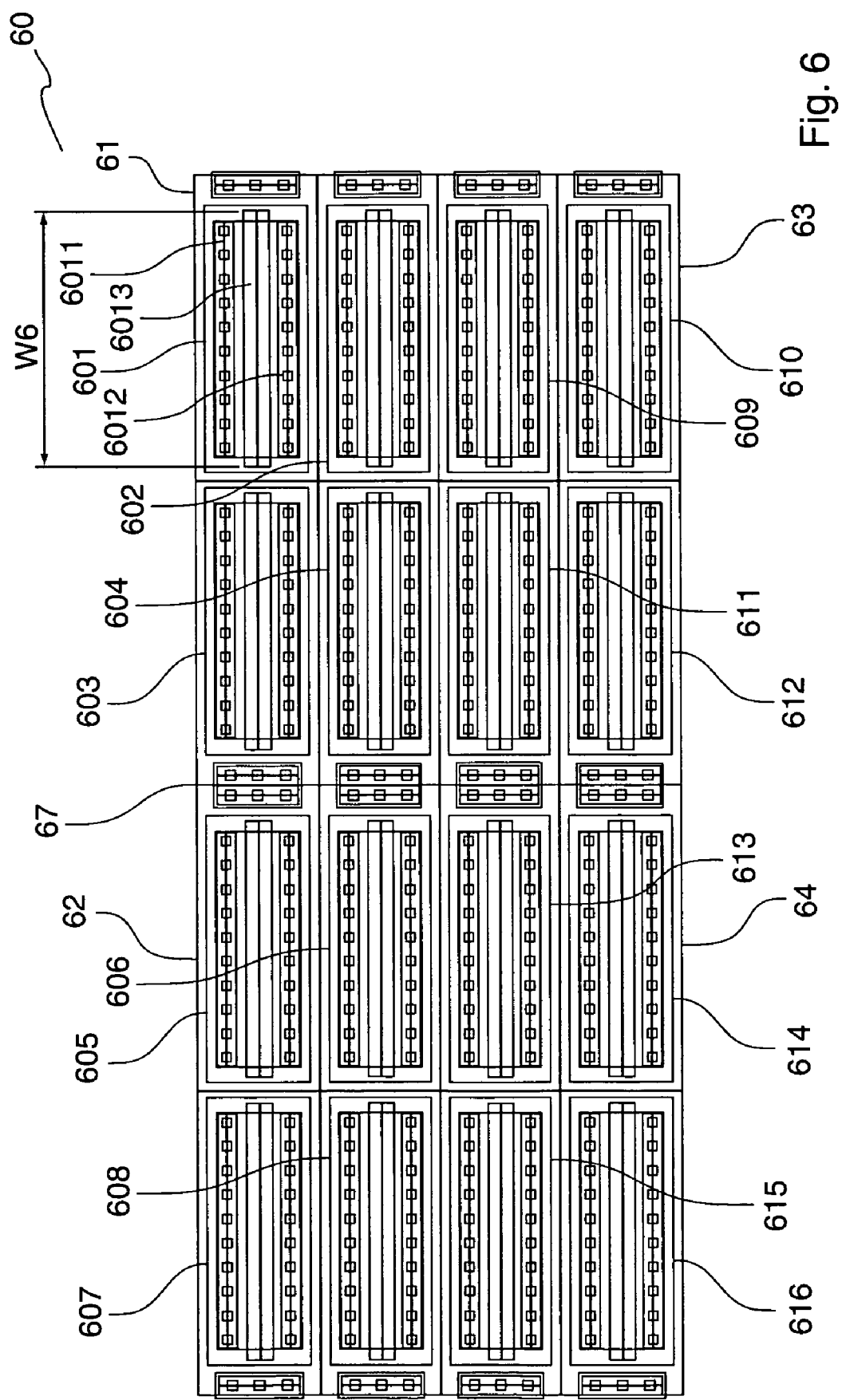
FIG. 6 is a diagram of the topology of the transistors of a differential VCO according to a first embodiment of the invention.

A diagram is shown in relation to FIG. 6 of the topology of the transistors of a differential VCO 60 according to a first embodiment of the invention in which the transistors are arranged as "crossed pairs".

The VCO 60 also includes sixteen P-type MOS transistors 601 to 616, forming first 601, 605, 609, 613, second 602, 606, 610, 614, third 603, 607, 611, 615 and fourth 604, 608, 612, 616 transistors of four differential pairs 61 to 64 (the other components of the VCO 60 are not shown in this FIG. 6).

For example, the first transistor 601 of the differential pair 61 of the VCO 60 has a source 6011, a drain 6012, and a gate 6013.

Unlike the topology of the conventional differential VCO 50 (FIG. 5), in the topology according to this first embodiment of the invention, the four differential pairs 61 to 64 are manufactured in one and the same and single well 67.

In this way, this topology according to the first embodiment of the invention makes it possible to substantially reduce the semiconductor surface occupied by the differential pairs compared with the topology of the conventional differential VCO 50 in FIG. 5. For example, for transistors 601 to 616 that have a gate width (denoted w6) identical to that of the transistors 501 to 516 of the conventional VCO 50 (in other words substantially equal to 5 μm), a total surface occupied by the four differential pairs 61 to 64 is obtained that is substantially equal to 240 μm.

On the other hand, this topology according to the first embodiment of the invention makes it possible to reduce the parasitic capacitances related to the electrical strips compared with the topology of the conventional differential VCO 50. Indeed, it makes it possible to reduce the length (given the fact that the differential pairs 61 to 64 have been brought closer together) of the metal strips needed to establish the electrical connections of the differential VCO 60, and therefore the parasitic capacitances related to these electrical strips.

This topology according to the first embodiment of the invention additionally makes it possible to reduce the parasitic capacitances between the well and the substrate of the transistors 601 to 616. Among these parasitic capacitances, the bottom capacitance can be distinguished from the sidewall capacitance.

Indeed, the bottom CSURF1 and sidewall CPERI1 capacitances, for the four differential pairs 51 to 54 according to the topology of the conventional VCO 50 (implementing 1 well per differential pair) in FIG. 5, may be written:

$CSURF1 = 4H \cdot L \cdot Cjnwell$ and $CPERI1 = 4.2(H+L) \cdot Cjswnwell$ where H is the height of the wells 571 to 574, L is the length of the wells 571 to 574, Cjjnwell is the drain, source capacitance per unit area/NWELL (expressed as $F/m^2$), Cjswnwell is the drain, source sidewall capacitance/NWELL (expressed as F/m).

For the four differential pairs 61 to 64 according to the topology of the first embodiment of the invention implementing a single well 67 of length 2L and of height 2H, the bottom CSURF2 and sidewall CPERI2 capacitances may be written:

$CSURF2 = 4H \cdot L \cdot Cjnwell$ and $CPERI2 = 2(2H+2L) \cdot Cjswnwell$

For example, $Cjnwell = 9.55 \cdot 10^{-5}$ $F/m^2$ and $Cjswnwell = 3.65 \cdot 10^{-10}$ F/m.

For example, by taking H=3 μm and L=2 μm, we obtain CSURF1=2.29 fF, CPERI1=14.6 fF, CSURF2=2.29 fF and CPERI2=7.3 fF.

As a consequence, the topology according to the first embodiment of the invention makes it possible to reduce by 50% the parasitic sidewall capacitance compared with the topology of the conventional differential VCO in FIG. 5.

Figure 7:
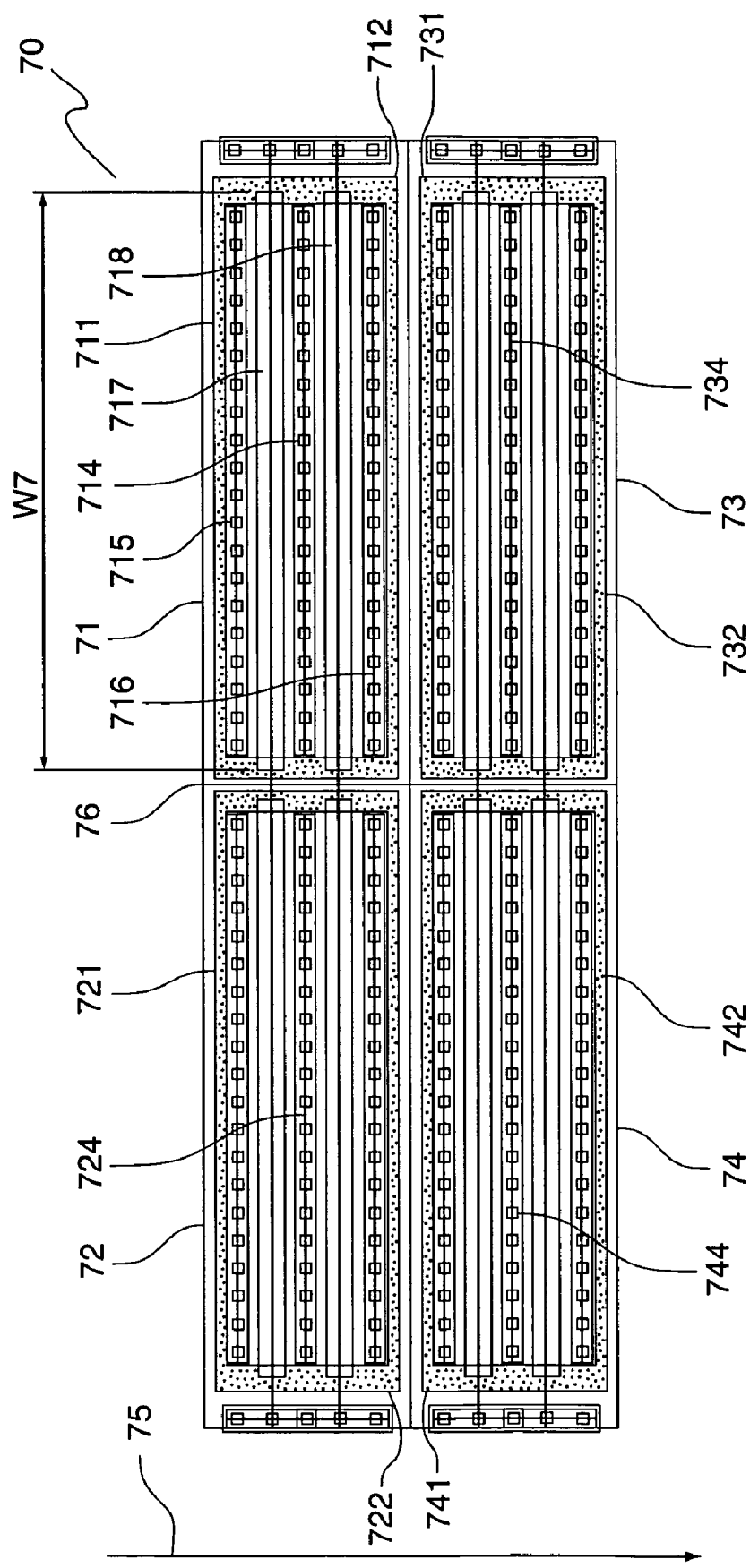
FIG. 7 is a diagram of the topology of the transistors of a differential VCO according to a second embodiment of the invention.

A diagram is presented in relation to FIG. 7 of the topology of the transistors of a differential VCO 70 according to a second embodiment of the invention, in which the transistors are not arranged as "crossed pairs".

This VCO 70 includes eight P-type MOS transistors 711, 721, 731, 741, 712, 722, 732, 742, forming first 711, 721, 731, 741 and second 712, 722, 732, 742 transistors of four differential pairs 71 to 74 (the other components of the VCO 70 are not shown in this FIG. 7).

The first 711 and second 712 transistors of the differential pair 71 of the VCO 70 each have a source 715, 716 respectively and a gate 717, 718 respectively.

In the same way as in the topology of the differential VCO 60 according to the first embodiment of the invention (FIG. 6), in the topology according to the second embodiment of the invention, the four differential pairs 71 to 74 are manufactured in one and the same and single well 76.

However, unlike the differential VCO 60 in FIG. 6, in which each of the differential pairs, arranged as crossed pairs, includes four transistors, each differential pair 71 to 74 of the differential VCO 70 according to an embodiment of the invention includes only one first 711, 721, 731, 741 and one second 712, 722, 732, 742 transistors. These transistors however have a gate width w7 approximately two times larger (for example w7=10 μm) than those of the transistors of the differential VCO 60.

On the other hand, in each differential pair 71 to 74 of the differential VCO 70, the first 711, 721, 731, 741 and second 712, 722, 732, 742 transistors share one and the same single drain 714, 724, 734, 744 respectively.

In this way, the four differential pairs 71 to 74 of the topology in FIG. 7 occupy a semiconductor surface that is smaller than the four differential pairs arranged according to the topology as "crossed pairs" of the first embodiment of the invention in FIG. 6 (and a fortiori even smaller than the four differential pairs arranged according to the conventional topology in FIG. 5).

Indeed, on the one hand, in each differential pair 71 to 74, in order to share a common drain 714, 724, 734, 744, the first and second transistors are brought closer together in a horizontal direction 75 compared with the "crossed pairs" topology of the first embodiment of the invention in FIG. 6.

And on the other hand, in the differential VCO 70 according to the second embodiment of the invention, each of the transistors of each of the differential pairs, for example the first transistors 711 of pair. 71, is equivalent to two transistors of a differential pair, for example the first and third transistors 601, 603 of the pair 61, of the VCO 60 according to the first embodiment of the invention in FIG. 6.

In this way, despite the fact that the transistors of the differential VCO 70 according to the second embodiment of the invention have a dual surface compared with those of the "crossed pairs" topology, a saving of inter-transistor surface is achieved in this the differential VCO 70 according to an embodiment of the invention.

For example, for first 711, 721, 731, 741 and second 712, 722, 732, 742 transistors that have a gate width substantially equal to 10 μm, a total surface occupied by the four differential pairs is obtained that is substantially equal to 185 μm, whereas we have a surface of 280 μm in the case of the "crossed pairs" topology in FIG. 6.

Furthermore, compared with the "cross pairs" topology, this topology according to the second embodiment of the invention makes it possible to reduce the number (given the common drains and reduced number of transistors) and the length (given the fact that the transistors have been brought closer together) of the metal strips needed to establish the electrical connections of the differential VCO 70, and therefore the parasitic capacitances related to these electrical strips.

For example, according to the "crossed pairs" topology (FIG. 5 and FIG. 6), it is necessary to make the connections between the first and fourth transistors and between the second and third transistors. In fact, these connections give rise, for each differential pair, to four intersecting metal strips, in other words four intersecting parasitic capacitances of about 1.5 fF each.

In the topology according to the second embodiment of the invention, these connections have no cause to be there, which gives freedom from sixteen intersecting parasitic capacitances of 1.5 fF each compared with the "crossed pairs" topology.

In the next place, this topology according to the second embodiment of the invention makes it possible to reduce the influence of the parasitic diffusion capacitances of the transistors of the differential VCO 70 compared with the parasitic diffusion capacitances of the transistors of the differential VCO 60 according to the first embodiment of the invention; and the conventional differential VCO 50.

Indeed the diffusion capacitance Cdiff1 seen by a source, for the pair of transistors 501 and 503 according to the conventional "crossed pairs" topology in FIG. 5, may be written:

$$Cdiff1=2Cja\cdot a\cdot b+2Cjb\cdot(2a+2b)=2Cja\cdot a\cdot b+Cjb\cdot(4a+4b)$$

where a is the source length of the transistors 501 and 503, b is the source width of the transistors 501 and 503, Cja is the junction capacitance per unit area (expressed as $F/m^2$), Cjb is the sidewall capacitance per unit length (expressed as F/m).

In the case of the first transistor 711 (the source length of which is substantially equal to 2a and the source width is substantially equal to b) according to the topology of the second embodiment of the invention, the diffusion capacitance CdiffDC2 seen by a source, may be written:

$$Cdiff2=2Cja\cdot a\cdot b+Cjb\cdot(4a+2b)=2Cja\cdot a\cdot b+Cjb\cdot(4a+2b)$$

For example, $Cja=1.28 \cdot 10^{-3}$ $F/m^2$ and $Cjb=3.28 \cdot 10^{-10}$ F/m.

In a first example of a transistor that has a relatively significant source length: a=16 µm and b=0.47 µm, we obtain Cdiff1=40.85 fF and Cdiff2=40.55 fF.

In a second example of a transistor that has a relatively small source length: a=1 µm and b=0.47 µm, we get Cdiff1=3.1 fF and Cdiff2=2.8 fF.

As a consequence, in the case of small size transistors, like the one in the aforementioned second example, the topology according to the second embodiment of the invention makes it possible to reduce the diffusion capacitance by 10% compared with the "crossed pairs" topology.

Given that the transistors of the differential VCO in FIG. 7 are not arranged as "crossed pairs" and that they are of small dimensions (for example, of the order of 2 µm for the length of the source and drain diffusion zones and 0.47 µm for their width), these transistors are not generally of uniform dimensions.

This lack of uniformity in respect of the dimensions of the transistors 711, 721, 731, 741, 712, 722, 732, 742 of the differential pairs 71 to 74 generates an offset between the two inputs of each of the pairs 71 to 74.

However, contrary to the opinion of the man skilled in the art, these offsets do not harm the operation of the differential VCO 70, on the contrary, these offsets are an advantage when starting the oscillator.

Generally speaking, differential VCOs use the noise of their power supply for their start-up (the noise is broadband and therefore includes a component that has the right frequency, which is amplified and which initiates the oscillation).

Figure 1:
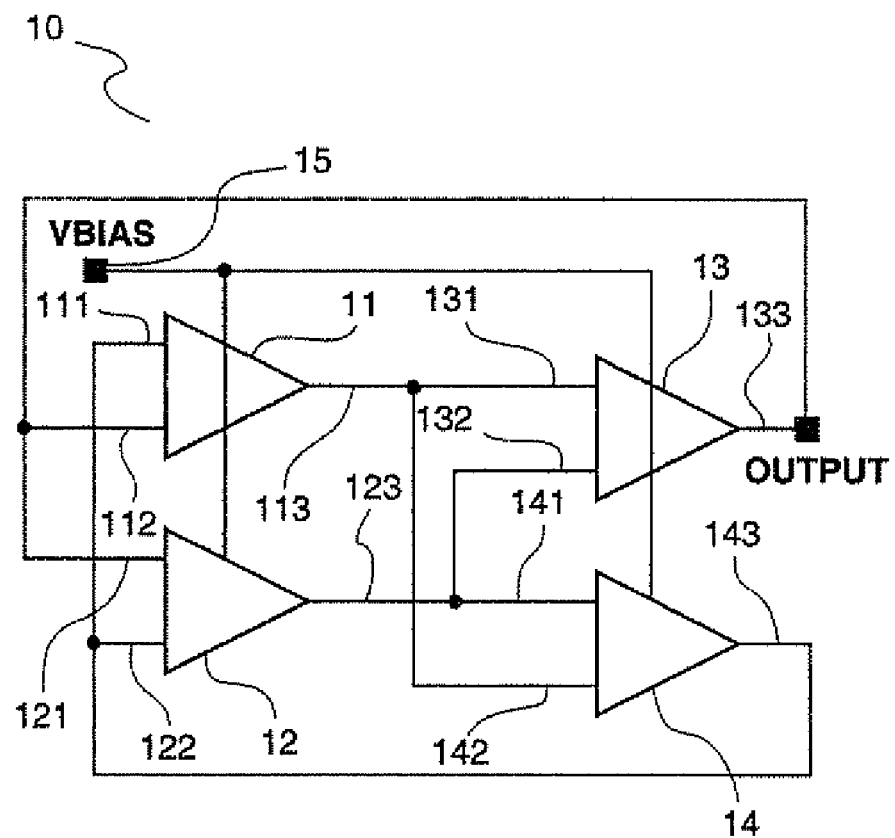
FIG. 1 shows a simplified diagram of a conventional differential VCO based on four amplifying stages.
Figure 3:
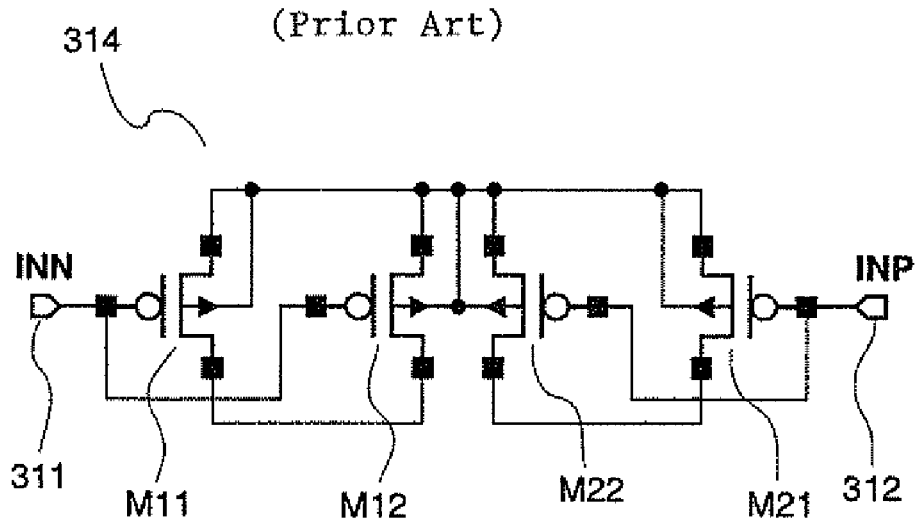
FIG. 3 shows the diagram of a conventional differential pair made from four transistors.
Figure 4:
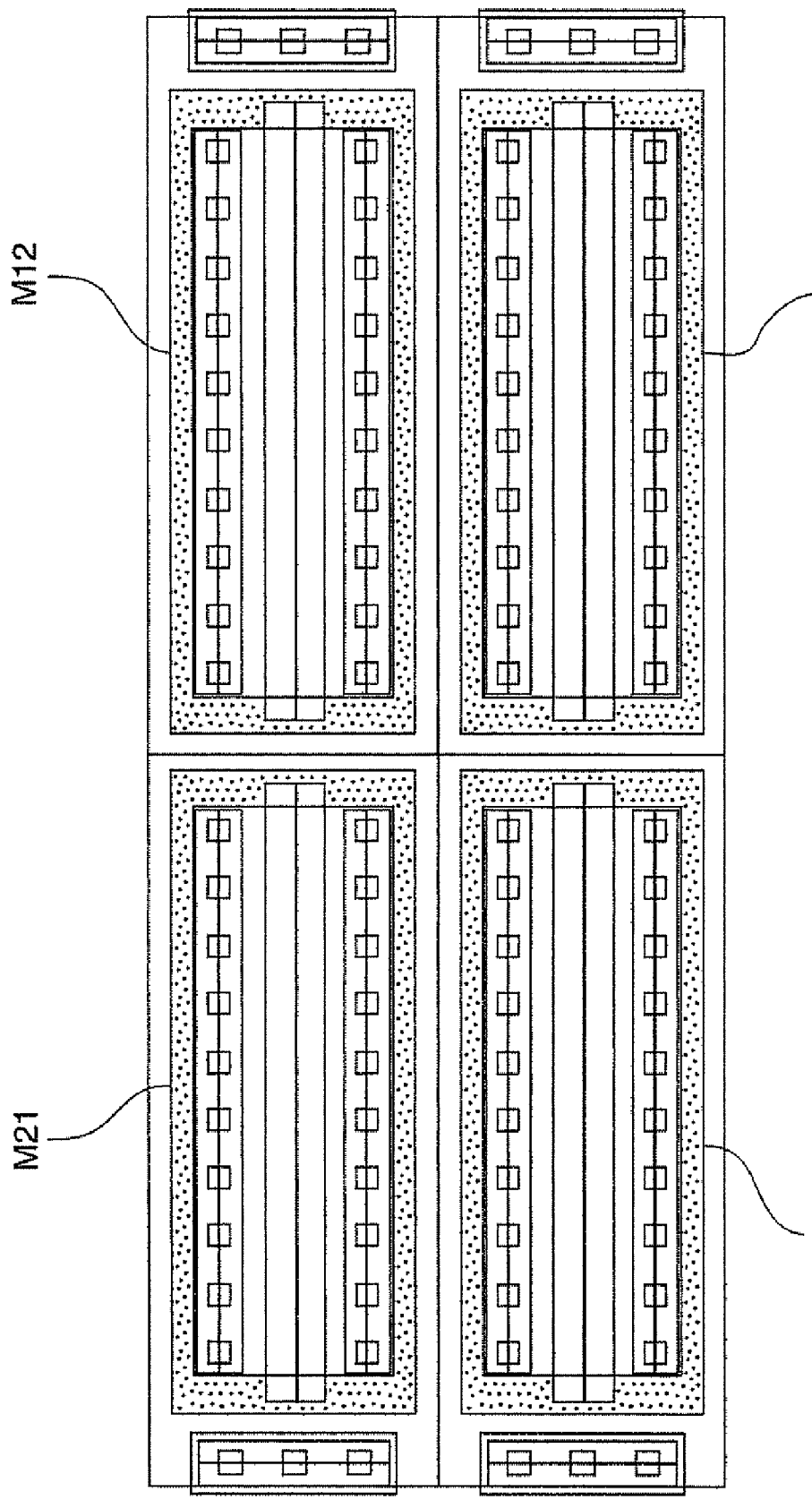
FIG. 4 is a diagram of the topology of the transistors of the differential pair in FIG. 3 in the case of a "crossed pair" arrangement.

However this start-up process is uncertain and takes time. Indeed, each amplifying stage of the differential VCO 10 in FIG. 1 reacts like a comparator, it is the voltage difference applied to its two differential inputs that allows an output voltage to be generated. In the assembly in FIG. 1, the four amplifying stages 11 to 14 generate instability in the operation of the VCO 10 and therefore an oscillation.

However, there is a risk that each of the inputs of the differential amplifiers may be at the same potential despite the presence of the power supply noise, which corresponds to a VCO rest point and therefore an absence of oscillation. The offsets between the inputs of each of the pairs 61 to 64 allow freedom from this rest point.

A description has been given, in relation to FIGS. 6 and 7, of two differential VCO topologies according to two embodiments of the invention in which only transistors of the PMOS type are employed. It should be noted that the man skilled in the art is also able to employ transistors of the NMOS type in these differential VCOs.

It should be noted that in this case, in each differential pair of the VCO 70 according to the second embodiment of the invention, the first and second transistors share one and the same source and not one and the same drain.

In summary, one or more embodiments of the invention overcome drawbacks of the prior art.

One aspect of an embodiment of the invention provides a differential VCO operating at high frequency and made in a very small-scale technology.

Another aspect of an embodiment of the invention implements a VCO of this kind that is high-performance and that in particular offers a reduction in parasitic capacitances compared with conventional VCOs.

Another aspect of an embodiment of the invention provides a VCO of this kind that requires a reduced number of stages during its manufacture and that occupies a small amount of semiconductor surface.

Yet another aspect of an embodiment of the invention implements a VCO of this kind that is straightforward and inexpensive to manufacture.

Clearly, the invention is not restricted to the embodiment examples mentioned above.

In particular one or more embodiments of the invention also apply to any electronic circuit that includes at least two differential pairs.

In particular, the person skilled in the art will be able to bring any variant into the choice of transistor type.

Although the present invention has been described with reference to one or more embodiments, workers skilled in the art will recognize that changes may be made in form and detail without departing from the spirit and scope of the invention.

What is claimed is:

1. An electronic circuit comprising at least one first and one second differential pair, wherein each of said first and second differential pairs is comprised in a different stage of said electronic circuit, each stage having its own inputs and output, and wherein each of said first and second differential pairs includes a plurality of transistors, wherein all the transistors of said first and second differential pairs are included in a single well.

2. The electronic circuit according to claim 1, wherein the circuit includes four amplifying stages, each amplifying stage including a differential pair, all the transistors of said differential pairs being included in a single well.

3. The electronic circuit according claim 1, wherein at least one of said differential pairs includes first and second transistors, which are P-type MOS transistors, and said first and second transistors share one and the same single drain.

4. The electronic circuit according to claim 1, wherein at least one of said differential pairs includes first and second transistors, which are N-type MOS transistors, and said first and second transistors share one and the same single source.

5. The electronic circuit according to claim 1, wherein the circuit is manufactured by means of a technology with a pitch below 0.5 µm.

6. The electronic circuit according to claim 1, wherein the circuit is a voltage-controlled oscillator.

7. The electronic circuit according to claim 6, wherein the circuit is designed to operate at a frequency above 300 MHz.

* * * * *

UNITED STATES PATENT AND TRADEMARK OFFICE
CERTIFICATE OF CORRECTION

PATENT NO. : 7,598,819 B2  Page 1 of 1
APPLICATION NO. : 11/311931
DATED : October 6, 2009
INVENTOR(S) : Gibet et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 308 days.

Signed and Sealed this

Twenty-eighth Day of September, 2010

David J. Kappos
*Director of the United States Patent and Trademark Office*